United States Patent
Lan et al.

(10) Patent No.: US 9,828,527 B2
(45) Date of Patent: Nov. 28, 2017

(54) CHEMICAL-MECHANICAL POLISHING COMPOSITIONS COMPRISING N,N,N',N'-TETRAKIS-(2-HYDROXYPROPYL)-ETHYLENEDIAMINE OR METHANESULFONIC ACID

(71) Applicant: BASF SE, Ludwigshafen (DE)

(72) Inventors: Yongqing Lan, Ludwigshafen (DE); Peter Przybylski, Ludwigshafen (DE); Zhenyu Bao, Potsdam, NY (US); Julian Proelss, Worms (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/336,245

(22) Filed: Oct. 27, 2016

(65) Prior Publication Data

US 2017/0044402 A1    Feb. 16, 2017

Related U.S. Application Data

(62) Division of application No. 14/770,185, filed as application No. PCT/IB2014/061236 on May 6, 2014, now abandoned.

(30) Foreign Application Priority Data

May 15, 2013    (EP) .................................. 13167899

(51) Int. Cl.
| | | |
|---|---|---|
| B44C 1/22 | (2006.01) | |
| C03C 15/00 | (2006.01) | |
| C03C 25/68 | (2006.01) | |
| C23F 1/00 | (2006.01) | |
| C09G 1/02 | (2006.01) | |
| C09K 3/14 | (2006.01) | |
| H01L 21/306 | (2006.01) | |

(52) U.S. Cl.
CPC .............. *C09G 1/02* (2013.01); *C09K 3/1436* (2013.01); *C09K 3/1463* (2013.01); *H01L 21/30625* (2013.01)

(58) Field of Classification Search
USPC ............................................ 216/89; 438/693
See application file for complete search history.

(56) References Cited

U.S. PATENT DOCUMENTS

| | | |
|---|---|---|
| 2007/0037892 A1 | 2/2007 | Belov |
| 2011/0250754 A1 | 10/2011 | Hirano et al. |
| 2013/0146804 A1 | 6/2013 | Mizuno |

FOREIGN PATENT DOCUMENTS

| | | |
|---|---|---|
| CN | 1532245 A | 9/2004 |
| CN | 101457123 A | 6/2009 |
| JP | 6-228717 A | 8/1994 |
| JP | 2007-46125 A | 2/2007 |
| JP | 2010-235976 A | 10/2010 |
| JP | 2014-198874 A | 10/2014 |
| WO | WO 2006/028759 A2 | 3/2006 |

OTHER PUBLICATIONS

International Search Report dated Jan. 28, 2015 in PCT/IB2014/061236.

*Primary Examiner* — Roberts Culbert

(74) *Attorney, Agent, or Firm* — Oblon, McClelland, Maier & Neustadt, L.L.P.

(57) ABSTRACT

Described is a chemical-mechanical polishing (CMP) composition comprising the following components:
(A) surface modified silica particles having a negative zeta potential of −15 mV or below at a pH in the range of from 2 to 6
(B) N,N,N',N'-tetrakis-(2-hydroxypropyl)-ethylenediamine or methanesulfonic acid
(C) water
(D) optionally one or more further constituents,
wherein the pH of the composition is in the range of from 2 to 6.

6 Claims, No Drawings

CHEMICAL-MECHANICAL POLISHING COMPOSITIONS COMPRISING N,N,N',N'-TETRAKIS-(2-HYDROXYPROPYL)-ETHYLENEDIAMINE OR METHANESULFONIC ACID

This application is a divisional application of U.S. Ser. No. 14/770,185 filed on Aug. 25, 2015 which is a 371 application of PCT/IB2014/061236 filed on May 6, 2014.

FIELD OF THE INVENTION

The present invention relates to a chemical-mechanical polishing composition comprising surface modified silica particles having a negative zeta potential of −15 mV or below at a pH in the range of from 2 to 6 and N,N,N',N'-tetrakis-(2-hydroxypropyl)-ethylenediamine or methanesulfonic acid, as well as to the use of N,N,N',N'-tetrakis-(2-hydroxypropyl)-ethylenediamine or methanesulfonic acid as additive for a chemical mechanical polishing (CMP) composition. The present invention also relates to a process for the manufacture of semiconductor devices comprising the chemical-mechanical polishing of a substrate or layer in the presence of said chemical-mechanical polishing (CMP) composition.

DESCRIPTION OF THE PRIOR ART

In the semiconductor industry, chemical mechanical polishing is a well-known technology applied in fabricating advanced photonic, microelectromechanical and microelectronic materials and devices, such as semiconductor wafers.

During the fabrication of materials and devices used in the semiconductor industry, CMP is employed to planarize surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP processes in the presence of a CMP composition comprising surface modified silica particles are known and described, for instance, in the following references.

WO 2006/028759 A2 describes an aqueous slurry composition for polishing/planarization substrates which are utilized in the process of metal interconnect formation on IC devices. Said slurry comprising silicon dioxide abrasive particles wherein said abrasive particles are anionically modified/doped with metallate anions selected from the group consisting of aluminate, stannate, zincate and plumbate, thereby providing a high negative surface charge to said abrasive particles and enhancing the stability of said slurry composition.

EP 2 533 274 A1 discloses a chemical mechanical polishing aqueous dispersion comprising (A) silica particles that include at least one functional group selected from a group consisting of a sulfo group and salts thereof, and (B) an acidic compound.

OBJECTS OF THE INVENTION

One of the objects of the present invention is to provide a CMP composition and a CMP process especially for the chemical-mechanical polishing of III-V materials, particularly GaAs and InP substrates which are utilized in the front-end-of-line (FEOL) IC production to form transistors, and showing an improved polishing performance, especially
(i) a high material removal rate (MRR) of a III-V material, for example GaAs and/or InP.
(ii) high surface quality of the III-V material, for example GaAs and/or InP, after the CMP step,
(iii) safe handling and reduction of hazardous by-products—for example the toxic gasses $AsH_3$ and/or $PH_3$ in case of polishing GaAs and/or InP—to a minimum, or
(iv) or the combination of (i), (ii) and (iii).

Moreover, a CMP process was sought that is easy to apply and requires as few steps as possible.

SUMMARY OF THE INVENTION

According to a first aspect of the present invention, a chemical-mechanical polishing (CMP) composition is provided comprising the following components:
(A) surface modified silica particles having a negative zeta potential of −15 mV or below at a pH in the range of from 2 to 6.
(B) N,N,N',N'-tetrakis-(2-hydroxypropyl)-ethylenediamine or methanesulfonic acid,
(C) water,
(D) optionally one or more further constituents,
wherein the pH of the composition is in the range of from 2 to 6.

In a further aspect, the present invention relates to the use of N,N,N',N'-tetrakis-(2-hydroxypropyl)-ethylenediamine or methanesulfonic acid as an additive for a chemical-mechanical polishing (CMP) composition, preferably as an additive for a chemical-mechanical polishing (CMP) composition comprising surface modified silica particles having a negative zeta potential of −15 mV or below at a pH in the range of from 2 to 6. A preferred use according to the invention is the use of N,N,N',N'-tetrakis-(2-hydroxypropyl)-ethylenediamine or methanesulfonic acid as an additive for a chemical-mechanical polishing (CMP) composition, wherein the additive is an additive for increasing the removal rate of a III-V material, wherein the III-V material is preferably selected from the group consisting of GaN, GaP, GaAs, GaSb, AlAsAlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb and GaInAsSb.

According to a further aspect of the invention there is provided a process for the manufacture of semiconductor devices comprising the chemical-mechanical polishing of a substrate or layer in the presence of a chemical-mechanical polishing (CMP) composition as defined hereinabove or hereinbelow.

Generally, the semiconductor device which can be manufactured by the process according to the invention is not particularly limited. Thus the semiconductor devices can be electronic components comprising semiconducting materials, as for example silicon, germanium, and III-V materials. Semiconductor devices can be those which are manufactured as single discrete devices or those which are manufactured as integrated circuits (ICs) consisting of a number of devices manufactured and interconnected on a wafer. Semiconductor devices can be two terminal devices for example a diode, three terminal devices for example a bipolar transistor, four terminal devices for example a Hall effect sensor or multi-terminal devices. Preferably, said semiconductor device is a multi-terminal device. Multi-terminal devices can be logic devices as integrated circuits and microprocessors or memory devices as random access memory (RAM), read only memory (ROM) and phase change random access memory (PCRAM). Preferably said semiconductor device is a multi-terminal logic device. In particular said semiconductor device is an integrated circuit or microprocessor.

In a further aspect, the present invention relates to the use of a chemical-mechanical polishing (CMP) composition as defined hereinabove or hereinbelow for polishing a substrate or layer containing one or more III-V materials wherein the or at least one of or all III-V materials are preferably selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaInAsSb.

Preferred embodiments are explained in the claims and the specification. It is understood that combinations of preferred embodiments are within the scope of the present invention.

In a preferred process according to the present invention the substrate or layer contains one or more III-V materials. Preferably the one or at least one of or all the III-V materials are selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb and GaInAsSb.

A semiconductor device can be manufactured by the process of the invention. Said process preferably comprises the chemical mechanical polishing of a substrate or layer—preferably a layer—containing one or more III-V materials in the presence of the CMP composition as defined hereinabove or hereinbelow.

If the III-V material has the shape of a layer, the content of all III-V material contained in the layer is preferably more than 90%, more preferably more than 95%, most preferably more than 98%, particularly more than 99%, for example more than 99.9% by weight of the corresponding layer. A III-V material is a material consisting of at least one group 13 element (including Al, Ga, In) and at least one group 15 element (including N, P, As, Sb). The terms "group 13" and "group 15" refer to the current IUPAC convention for naming the groups in the periodic table of chemical elements. Preferably, said III-V material is GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, or GaInAsSb. More preferably, said III-V material is GaN, GaP, GaAs, GaSb, InP, InAs, InSb, InGaAs, or InAlAs. Most preferably, said III-V material is GaN, GaP, GaAs, GaAs, InP, or InAs. Particularly, said III-V material is GaAs (gallium arsenide) and/or InP (indium phosphide).

The CMP composition of the present invention is used for chemical-mechanical polishing of a substrate or layer—preferably a layer—containing one or more III-V materials, preferably for chemical-mechanical polishing of a layer containing one or more III-V materials. If the III-V material has the shape of a layer, the content of all III-V material contained in the layer is preferably more than 90%, more preferably more than 95%, most preferably more than 98%, particularly more than 99%, for example more than 99.9% by weight of the corresponding layer. Preferably, said III-V material is GaN, GaP, GaAs, GaSb, AlAs, AlN, InP, InAs, In—Sb, InGaAs, InAlAs, Al—GaAs, GaAlN, GaInN, InGaAlAs, InGaAsP, InGaP, AlInP, GaAlSb, GaInSb, GaAl-AsSb, or GaInAsSb. More preferably, said III-V material is GaN, GaP, GaAs, GaSb, MP, InAs, InSb, In—GaAs, or InAlAs. Most preferably, said III-V material is GaN, GaP, GaAs, GaAs, InP, or InAs. Particularly, said III-V material is GaAs (gallium arsenide) and/or InP (indium phosphide).

The CMP composition of the present invention comprises the components (A), (B), and (C) water and optionally further component (D) as described below.

Component (A): surface modified silica particles having a negative zeta potential −15 mV or below at a pH in the range of from 2 to 6

The surface-modified silica particles have a zeta potential more negative than −15 mV, preferably, more negative than −25 mV, and most preferably more negative than −30 mV.

The surface modified silica particles are silica particles, preferably colloidal silica particles which are stabilized as the result of changes of the surface of the particles. The surface-modified silica particles are preferably amorphous and not agglomerated and thus typically occur in the form of discrete spheres that are not crosslinked with each other and contain hydroxyl groups on the surface. Colloidal silica particles are obtainable by methods known in the art such as ion-exchange of silicic acid salt, or by sol-gel technique (e.g., hydrolysis or condensation of a metal alkoxide, or peptization of precipitated hydrated silicon oxide, etc.).

Preferably the surface modified silica particles of component (A) having a negative zeta potential of −15 mV or below at a pH in the range of from 2 to 6 are silica particles anionically modified with metallate ions or modified with sulfonic acid.

Sulfonic acid-modified aqueous anionic silica sols which are highly stable under acidic conditions are disclosed e.g. in WO 2010734542 A1. Herein, a sulfonic acid-modified aqueous anionic silica sol is obtained by a method wherein a silane coupling agent having a functional group which can be chemically converted into a sulfonic acid group is added to colloidal silica, and then the functional group is converted into a sulfonic acid group.

The term "anionically modified with metallate ions" as utilized herein in particular refers to silica particles where metallate ions (i.e., $M(OH)_4^-$) are incorporated in the surface of the silica particle replacing $Si(OH)_4$ sites and creating a permanent negative charge, as explained in WO 2006/028759 A2.

Preferably the surface modified silica particles of component (A) having a negative zeta potential of −15 mV or below at a pH in the range of from 2 to 6 are silica particles anionically modified with metallate ions selected from the group consisting of aluminate, stannate, zincate, and plumbate. Most preferably the surface modified silica particles of component (A) having a negative zeta potential of −15 mV or below at a pH in the range of from 2 to 6 are silica particles anionically modified with aluminate. Such surface modified silica particles are disclosed e.g. in WO 2006/7028759 A2.

Generally, the particles (A) can be contained in varying amounts in the CMP composition of the present invention. Preferably, the amount of (A) is not more than 30 wt. % (wt. % in each case stands for "percent by weight"), more preferably not more than 5 wt. %, most preferably not more than 3 wt. %, particularly preferably not more than 2.5 wt. %, for example not more than 1.5 wt. %, in each case based on the total weight of the composition of the present invention Preferably, the amount of (A) is at least 0.1 wt. %, particularly at least 0.4 wt. %, for example 1 wt. %, in each case based on the total weight of the composition of the present invention.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The average particle size of the surface-modified silica is preferably in the range of from 1 to 200 nm, preferably of from 5 to 140 nm, and most preferably of from 10 to 100 nm. The term "particle size" as utilized herein refers to the average diameter of particles as measured by standard particle sizing instruments and methods, such as dynamic light scattering techniques, laser diffusion diffraction techniques, ultracentrifuge analysis techniques, etc. If not indicated otherwise dynamic light scattering techniques are preferred.

The BET surface determined according to DIN ISO 9277 of the silica particles can vary within a wide range. Preferably, the BET surface of the silica particles is in the range of from 1 to 500 $m^2/g$, more preferably in the range of from 5 to 350 $m^2/g$, most preferably in the range of from 10 to 300 $m^2/g$, in particular in the range of from 50 to 250 $m^2/g$, for example in the range of from 100 to 220 $m^2/g$.

Component (B): N,N,N',N'-tetrakis-(2-hydroxypropyl)-ethylenediamine or methanesulfonic acid Generally, the component (B) (N,N,N',N'-tetrakis-(2-hydroxypropyl)-ethylenediamine or methanesulfonic acid) can be contained in varying amounts in the CMP composition of the present invention. Preferably, the amount of (B) is not more than 3 wt. % (wt. % in each case stands for "percent by weight"), more preferably not more than 2 wt. %, most preferably not more than 1 wt. %, particularly preferably not more than 0.5 wt. %, based in each case on the total weight of the composition of the present invention. Preferably, the amount of (B) is at least 0.01 wt. %, particularly at least 0.05 wt. %, for example 0.1 wt. %, based in each case on the total weight of the composition of the present invention.

If the CMP composition of the present invention comprises N,N,N',N'-tetrakis-(2-hydroxypropyl)-ethylenediamine (in component (B)), the simultaneous presence of methanesulfonic acid is not preferred, and vice versa. Thus, preferably the composition comprises either N,N,N',N'-tetrakis-(2-hydroxypropyl)-ethylenediamine or methanesulfonic acid in component (B), while the respective other compound of component (B) is not present in the composition.

N,N,N',N'-tetrakis-(2-hydroxypropyl)-ethylenediamine as well as methanesulfonic acid are commercially available, for example as Lutropor® Q75 (BASF SE) and Lutropor® MSA (BASF SE), reap, and the way of preparing said compounds is known to those skilled in the art.

Optional Further Constituents (D)

A CMP composition according to the present invention may comprise further constituents, depending on the specific requirements of the intended use of said CMP composition. Preferably the one or at least one of or all of the further constituents of component (D) are selected from the group consisting of oxidizing agents, abrasive materials different from surface modified silica particles having a negative zeta potential of −15 mV or below at a pH in the range of from 2 to 6, stabilizers, surfactants, friction reducing agents, buffer substances.

The CMP composition of the present invention can further optionally comprise one or more types of oxidizing agent (D1), preferably one to two types of oxidizing agent (D1), more preferably one type of oxidizing agent (D1). The oxidizing agent (D1) is different from the components (A), (B) and (C) water. In general, the oxidizing agent is a compound which is capable of oxidizing the to-be-polished substrate or one of its layers. Preferably, (D1) is a per-type oxidizer. More preferably, (D1) is a peroxide, persulfate, perchlorate, perbromate, periodate, permanganate, or a derivative thereof. Most preferably, (D1) is a peroxide or persulfate. Particularly, (D1) is a peroxide. For example, (D1) is hydrogen peroxide.

If present, the oxidizing agent (D1) can be contained in varying amounts in the CMP composition of the present invention. Preferably, the amount of (D1) is not more than 20 wt. % (wt. % in each case stands for "percent by weight"), more preferably not more than 10 wt. %, most preferably not more than 5 wt. %, particularly not more than 3.5 wt. %, for example not more than 2.7 wt. %, in each case based on the total weight of the CMP composition of the present invention. Preferably, the amount of (D1) is at least 0.01 wt. %, more preferably at least 0.08 wt. %, most preferably at least 0.4 wt. %, particularly at least 0.75 wt. %, for example at least 1 wt. %, in each case based on the total weight of the composition of the present invention. If hydrogen peroxide is used as oxidizing agent (D1), the amount of (D1) is preferably 1 wt. % to 5 wt. %, more preferably 2 wt. % to 3.5 wt. %, for instance 2.5 wt. %, in each case based on the total weight of the CMP composition of the present invention.

The CMP composition of the present invention can further optionally contain one or more biocides (D2), for example one biocide. The biocide (D2) is different from the components (A), (B), (C) and from constituent (D1) of component (D). In general, the biocide is a compound which deters, renders harmless, or exerts a controlling effect on any harmful organism by chemical or biological means. Preferably, (D2) is an quaternary ammonium compound, an iso-thiazolinone-based compound, an N-substituted diazenium dioxide, or an N'-hydroxy-diazenium oxide salt. More preferably, (D2) is an N-substituted diazenium dioxide, or an N'-hydroxy-diazenium oxide salt.

If present, the biocide (D2) can be contained in varying amounts in the CMP composition of the present invention. If present, the amount of (D2) is preferably not more than 0.5 wt. % (wt. % in each case stands for "percent by weight"), more preferably not more than 0.1 wt. %, most preferably not more than 0.05 wt. %, particularly not more than 0.02 wt. %, for example not more than 0.008 wt. %, in each case based on the total weight of the corresponding composition. If present, the amount of (D2) is preferably at least 0.0001 wt. %, more preferably at least 0.0005 wt. %, most preferably at least 0.001 wt. %, particularly at least 0.003 wt. %, for example at least 0.006 wt. %, in each case based on the total weight of the corresponding CMP composition of the present invention.

The CMP composition of the present invention can further optionally contain one or more corrosion inhibitors (D3), for example one corrosion inhibitor. The corrosion inhibitor (D3) is different from the components (A), (B), (C) and from constituents (D1) and (D2) of component (D). In general, all compounds forming a protective molecular layer on the surface of a III-V material—for example GaAs—can be used as corrosion inhibitor. Suitable corrosion inhibitors are known in the art.

If present, the corrosion inhibitor (D3) can be contained in varying amounts in the CMP composition of the present invention. If present, the amount of (D3) is preferably not more than 10 wt. % (wt. % in each case stands for "percent by weight"), more preferably not more than 2 wt. %, most preferably not more than 0.5 wt. %, particularly not more than 0.1 wt. %, for example not more than 0.05 wt. %, in each case based on the total weight of the corresponding composition. If present, the amount of (D3) is preferably at least 0.0005 wt. %, more preferably at least 0.005 wt. %, most preferably at least 0.025 wt. %, particularly at least 0.1 wt. %, for example at least 0.4 wt. %, in each case based on the total weight of the composition of the present invention.

The properties of the CMP composition of the present invention, such as stability and polishing performance, may depend on the pH of the corresponding composition. The pH value of the CMP composition of the present invention is in the range of from 2 to 6 preferably from 2.2 to 6, more preferably from 2.5 to 5.8, further preferably from 2.5 to 5.5, still further preferably from 2.8 to 5.5, especially preferably from 3 to 5.2, particularly preferably from 3 to 5, more particular preferably from 3.2 to 5, particularly from 3.5 to 4.5, for example 4.

The CMP composition of the present invention can further optionally contain one or more buffer substances (D4). The buffer substance (D4) is different from the components (A), (B), (C) and from constituents (D1), (D2) and (D3) of component (D). In general, the buffer substance (D4) is a compound which is added to the CMP composition of the present invention to have its pH value adjusted to the required value. Preferred buffer substances are inorganic acids, carboxylic acids, amine bases, alkali hydroxides, ammonium hydroxides, including tetraalkylammoniurn hydroxides. For example, the buffer substance (D4) is nitric acid, sulfuric acid, ammonia, sodium hydroxide, or potassium hydroxide.

If present, the buffer substance (D4) can be contained in varying amounts in the CMP composition of the present invention. If present, the amount of (D4) is preferably not more than 10 wt. % (wt. % in each case stands for "percent by weight"), more preferably not more than 2 wt. %, most preferably not more than 0.5 wt. %, particularly not more than 0.1 wt. %, for example not more than 0.05 wt. %, in each case based on the total weight of the corresponding composition. If present, the amount of (D4) is preferably at least 0.0005 wt. %, more preferably at least 0.005 wt. %, most preferably at least 0.025 wt. %, particularly at least 0.1 wt. %, for example at least 0.4 wt. %, in each case based on the total weight of the CMP composition of the present invention.

The CMP composition of the present invention may also contain, if necessary, one or more other additives, including but not limited to stabilizers, surfactants, friction reducing agents, etc. Said other additives is different from the components (A) (B), (C), and from constituents (D1), (D2), (D3) and (D4) of component (D). Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts in the CMP composition of the present invention. Preferably, the total amount of said other additives is not more than 10 wt. % (wt. % in each case stands for "percent by weight"), more preferably not more than 2 wt. %, most preferably not more than 0.5 wt. %, particularly not more than 0.1 wt. %, for example not more than 0.01 wt. %, in each case based on the total weight of the corresponding CMP composition. Preferably, the total amount of said other additives is at least 0.0001 wt. %, more preferably at least 0.001 wt. %, most preferably at least 0.008 wt. %, particularly at least 0.05 wt. %, for example at least 0.3 wt. %, in each case based on the total weight of the corresponding CMP composition of the present invention.

Preferably, the chemical-mechanical polishing (CMP) composition does not comprise any abrasive materials different from above-defined surface modified silica particles having a negative zeta potential of −15 mV or below at a pH in the range of from 2 to 6.

Particularly preferred is a chemical-mechanical polishing (CMP) composition according to the present invention wherein
the total amount of (A) surface modified silica particles having a negative zeta potential of −15 mV or below at a pH in the range of from 2 to 6 is in the range of from 0.1 to 30 wt. % based on the total weight of the CMP composition of the present invention
and/or
the total amount of (B) N,N,N',N'-tetrakis-(2-hydroxypropyl)-ethylenediamine or methanesulfonic acid is in the range of from 0.01 to 3 wt %, based on the total weight of the CMP composition of the present invention.

It is understood that the above-defined preferred CMP compositions of the present invention have a pH of from 2 to 6 as described above.

Processes for preparing CMP compositions are generally known. These processes may be applied to the preparation of the CMP composition of the present invention. This can be carried out by dispersing or dissolving the above-described components (A) and (B), and if appropriate the optional further constituents of component (D) in water, and optionally by adjusting the pH value through adding a buffer substance (D4) as defined hereinabove or hereinbelow. For this purpose the customary and standard mixing processes and mixing apparatuses such as agitated vessels, high shear impellers, ultrasonic mixers, homogenizer nozzles or counterflow mixers, can be used.

The CMP composition of the present invention is preferably prepared by dispersing the particles (A), dispersing and/or dissolving (B) N,N,N',N'-tetrakis-(2-hydroxypropyl)-ethylenediamine or methanesulfonic acid and optionally dispersing and/or dissolving the further constituents (D) in water (C).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition of the present invention is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1 in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality, especially when the substrate or layer to be polished contains one or more III-V materials.

The CMP composition of the present invention can be used in the CMP process as ready-to-use slurry, they have a long shelf-life and show a stable particle size distribution over long time. Thus, they are easy to handle and to store. They show an excellent polishing performance, particularly with regard to high material removal rate (MRR) and high surface quality combined with minimal generation of the toxic gasses $AsH_3$ and $PH_3$. Since the amounts of its components are hold down to a minimum, the CMP composition of the present invention and the CMP process according to the invention can be used or applied in a cost-effective way.

EXAMPLES AND COMPARATIVE EXAMPLES

General Procedure for the CMP Experiments

For the evaluation on benchtop polisher, the following parameters were chosen:

Procedure setting: Phoenix 4000 polisher; table/carrier 200/150 rpm; down force 2.5 psi (17238 Pa); slurry flow rate 18 mL/min; pad IC 1000; time 1 min.

The pad is conditioned by several sweeps, before a new type of CMP composition is used for CMP. For the determination of removal rates at least 3 wafers are polished and the data obtained from these experiments are averaged.

The CMP composition is stirred in the local supply station.

Object to be polished: unstructured GaAs wafers and unstructured InP wafers.

The GaAs material removal rates (referred to as "GaAs-MRR" in the following) for 2 inch (=5.08 cm) discs polished by the CMP composition are determined by difference of weight of the coated wafers or blanket discs before and after CMP, using a Sartorius LA310 S scale. The difference of weight can be converted into the difference of film thickness since the density (5.32 $g/cm^3$ for GaAs) and the surface area of the polished material are known. Dividing the difference of film thickness by the polishing time provides the values of the material removal rate. The InP material removal rates (referred to as "Inp-MRR" in the following) were determined in the same manner.

The surface quality of GaAs layers and InP layers was measured by root mean square roughness (RMS) on polished substrates with Atomic Force Microscopy (AFM) (Dimension FastScan, Bruker) with scan area 5 μm×5 μm using Tapping Mode™ (=intermittent contact mode) as scanning mode.

Standard Procedure for Slurry Preparation

The components (A), (B) and (D1)—each in the amounts as indicated in table 1—were dispersed or dissolved in de-ionized water. pH is adjusted by adding of aqueous 10% KOH solution or $HNO_3$ (0.1%-10%) solution to the slurry. The pH value is measured with a pH electrode (Schott, blue line, pH 0-14/−5 . . . 100° C./3 mol/L sodium chloride). Measurement of the Zeta Potential For measuring electrophoretic mobility and zeta potential of the silica particles (A) a standard Zetasizer Nano device from the company Malvern was used. The samples were diluted by a factor of 500 with 10 mmol/l KCl solution before measuring the mobility. The measurements were done at 23° C.

Examples 1 and 2 and Comparative Examples 1 and 2

In comparative example 1 and examples 1 and 2 according to the invention, the particles (A) are aluminate-modified anionic colloidal silica having a typical particle size of 15 nm, a typical surface area of 200 $m^2/g$ and a zeta potential of −40 my at pH 4, e.g. Levasil® 200A (from Akzo Nobel).

In comparative example 1, no additive (B) is present.

In comparative example 2, benzotriazole is present as additive (B).

In example 1 according to the invention, the additive (B) is N,N,N',N'-tetrakis-(2-hydroxypropyl)-ethylenediamine e.g. Lutropor® 075 (BASF SE).

In example 2 according to the invention the additive (B) is methanesulfonic acid, e.g. Lutropor® MSA (BASF SE).

Aqueous dispersions containing the components (A), (B) and (D1) as listed in table 1 were prepared, and the polishing performance data compiled in table 1 were determined.

| | Comparative example 1 | Comparative example 2 | Example 1 | Example 2 |
|---|---|---|---|---|
| Particles (A) (aluminate-modified silica) | 3.0 wt. % | 3.0 wt. % | 3.0 wt. % | 3.0 wt. % |
| Additive (B) | None | Benzotrizole, 0.1 wt. % | N,N,N',N'-tetrakis-(2-hydroxyproply)-ethylenediamine 0.1 wt. % | methane-sulfonic acid, 0.1 wt. % |

-continued

|  | Comparative example 1 | Comparative example 2 | Example 1 | Example 2 |
|---|---|---|---|---|
| Oxidizing agent (D1) | $H_2O_2$ 1.5 wt. % | $H_2O_2$ 1.5 wt. % | $H_2O_2$ 1.5 wt. % | $H_2O_2$ 1.5 wt. % |
| pH | 4 | 4 | 4 | 4 |
| GaAs MRR* (Å/min) | 2149 | 914 | 2358 | 2605 |
| InP MRR (Å/min) | 2551 | 312 | 2984 | 3671 |
| RMS on GaAs (nm) | >3 | >3 | >3 | >3 |
| RMS on InP (nm) | <0.5 | <0.5 | <0.5 | <0.5 |

The data in table 1 show that the additive (B) according to the present invention causes in increase of the material removal rate (MRR) on both GaAs and InP substrates. However, this effect is unique to the combination of the surface-modified silica particles (A) having a negative zeta potential of −15 mV or below at a pH in the range of from 2 to 6 with an additive (B) according to the invention, since replacement of the additive (B) according to the invention by another common additives like benzotriazole results in a decrease of both material removal rates. Despite the increase of the material removal rates, the surface quality was not compromised by the CMP composition of the present invention.

The invention claimed is:

1. A method for polishing a substrate or layer containing one or more III-V materials comprising contacting it with a chemical-mechanical polishing (CMP) composition comprising the following components:
   (A) surface modified silica particles having a negative zeta potential of −15 mV or below at a pH in the range of from 2 to 6,
   (B) N,N,N',N'-tetrakis-(2-hydroxypropyl)-ethylenediamine or methanesulfonic acid,
   (C) water
   (D) optionally one or more further constituents,
   wherein the pH of the composition is in the range of from 2 to 6;
   wherein at least one of the III-V materials is at least one material selected from the group consisting of GaN, GaP, GaAs, GaSb, AlAs, AlN, InP, InAs, InSb, InGaAs, InAlAs, AlGaAs, GaAlN, GaInN, InGaAlAs, InGaAsP, InGaP, AlInP, GaAlSb, GaInSb, GaAlAsSb, and GaIn AsSb.

2. The method according to claim 1, wherein the surface modified silica particles of component (A) having a negative zeta potential of −15 mV or below at a pH in the range of from 2 to 6 are silica particles anionically modified with metallate ions or modified with sulfonic acid.

3. The method according to claim 1, wherein the surface modified silica particles of component (A) having a negative zeta potential of −15 mV or below at a pH in the range of from 2 to 6 are silica particles anionically modified with at least one metallate ion selected from the group consisting of aluminate, stannate, zincate, and plumbate.

4. The method according to claim 1, wherein the surface modified silica particles of component (A) having a negative zeta potential of −15 mV or below at a pH in the range of from 2 to 6 are silica particles anionically modified with aluminate.

5. The method according to claim 1, wherein
   the total amount of (A) surface modified silica particles having a negative zeta potential of −15 mV or below at a pH in the range of from 2 to 6 is in the range of from 0.1 wt % to 30 wt %, based on the total weight of the chemical-mechanical polishing (CMP) composition
   and/or
   the total amount of (B) N,N,N',N'-tetrakis-(2-hydroxypropyl)-ethylenediamine or methanesulfonic acid is in the range of from 0.01 to 3 wt % based on the total weight of the chemical-mechanical polishing (CMP) composition.

6. The method according to claim 1, comprising one or more further constituents as component (D),
   wherein the one or at least one of or all of the further constituents of component (D) are selected from the group consisting of oxidizing agents, abrasive materials different from surface modified silica particles having a negative zeta potential of −15 mV or below at a pH in the range of from 2 to 6, stabilizers, surfactants, friction reducing agents, and buffer substances.

* * * * *